United States Patent
Perisetty

(10) Patent No.: US 10,200,037 B2
(45) Date of Patent: Feb. 5, 2019

(54) APPARATUS AND METHODS FOR ON-DIE TEMPERATURE SENSING TO IMPROVE FPGA PERFORMANCE

(71) Applicant: Altera Corporation, San Jose, CA (US)

(72) Inventor: Srinivas Perisetty, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 15/645,446

(22) Filed: Jul. 10, 2017

(65) Prior Publication Data

US 2017/0373690 A1    Dec. 28, 2017

Related U.S. Application Data

(63) Continuation of application No. 12/534,105, filed on Jul. 31, 2009, now Pat. No. 9,735,779.

(60) Provisional application No. 61/223,615, filed on Jul. 7, 2009.

(51) Int. Cl.
*H03K 19/003* (2006.01)
*H01L 49/02* (2006.01)
*H01L 23/34* (2006.01)

(52) U.S. Cl.
CPC ....... *H03K 19/00369* (2013.01); *H01L 28/00* (2013.01); *H01L 23/34* (2013.01)

(58) Field of Classification Search
None
See application file for complete search history.

(56) References Cited

U.S. PATENT DOCUMENTS

| 8,330,476 B2* | 12/2012 | Chan | G06F 1/26 |
| | | | 219/494 |
| 2001/0021217 A1* | 9/2001 | Gunther | G01K 7/015 |
| | | | 374/178 |
| 2006/0289862 A1* | 12/2006 | Yoshida | G06F 1/206 |
| | | | 257/48 |
| 2007/0030053 A1* | 2/2007 | Pan | G05F 3/30 |
| | | | 327/539 |
| 2009/0322409 A1* | 12/2009 | Levit | G06F 1/3203 |
| | | | 327/513 |

OTHER PUBLICATIONS

Actel; "Temperature Monitoring Techniques for Fusion;" Apr. 2007; 16 pages.
Xilinx; "Virtex-5 System Monitor User Guide;" Mar. 11, 2009, 66 pages.
Actel; "CoreAI;" Mar. 2006; 7 pages.
Actel; "IGLOO PLUS Low-Power Flash FPGAs;" Apr. 2009; 14 pages.
Xilinx; "Virtex-6 Family Overview;" Jun. 24, 2009; 9 pages.
Actel; "Fusion Family of Mixed-Signal FPGAs;" Jul. 2009; 18 pages.
Xilinx; "Virtex-4 FPGA User Guide;" Dec. 1, 2008; 406 pages.
Xilinx; "Virtex-5 Family Overview;" Feb. 6, 2009; 13 pages.
Xilinx; "Virtex-6 FPGA System Monitor User Guide;" Jun. 24, 2009; 62 pages.

* cited by examiner

*Primary Examiner* — Minh D A
*Assistant Examiner* — James H Cho
(74) *Attorney, Agent, or Firm* — Fletcher Yoder, P.C.

(57) ABSTRACT

A field programmable gate array (FPGA) includes a temperature sensor array. The FPGA also includes a supply voltage modulation circuit. The supply voltage modulation circuit is coupled to the temperature sensor array.

19 Claims, 11 Drawing Sheets

APPARATUS AND METHODS FOR ON-DIE TEMPERATURE SENSING TO IMPROVE FPGA PERFORMANCE

CROSS-REFERENCE TO RELATED APPLICATIONS

This application is a continuation of U.S. patent application Ser. No. 12/534,105 filed Jul. 31, 2009, issued as Pat. No. 9,735,779, and entitled "Apparatus and Methods for On-Die Temperature Sensing to Improve FPGA Performance", which claims priority to and the benefit of, U.S. Provisional Patent Application No. 61/223,615, filed on Jul. 7, 2009, "Apparatus and Methods for On-Die Temperature Sensing to Improve FPGA Performance," the entirety of which are incorporated by reference for all purposes.

TECHNICAL FIELD

The disclosed concepts relate generally to improving the performance of field programmable gate arrays (FPGAs) and, more particularly, to apparatus for and methods for on-die temperature sensing to improve FPGA performance.

BACKGROUND

Advances in microelectronics have enabled the continued increase in transistor densities of FPGAs. Advanced integrated circuits, such as FPGAs, can include hundreds of millions of transistors. The relatively large number of transistors enables circuit designers to integrate a relatively large number of functions. The design of the chips entails competing factor or considerations, such as speed, power dissipation, and cost.

SUMMARY

The disclosed concepts relate generally to improving the performance of field programmable gate arrays (FPGAs) and, more particularly, to apparatus for and methods for on-die temperature sensing to improve FPGA performance. In one exemplary embodiment, an FPGA includes a temperature sensor array, and a supply voltage modulation circuit coupled to the temperature sensor array.

In another exemplary embodiment, an FPGA includes a temperature sensor array, and a body bias modulation circuit coupled to the temperature sensor array.

In yet another exemplary embodiment, a method of operating an FPGA includes using a temperature sensor array to obtain a plurality of temperature values for a die of the FPGA. The method further includes modulating, based on the plurality of temperature values, at least one of a supply voltage of the FPGA and a body bias of the FPGA.

BRIEF DESCRIPTION OF THE DRAWINGS

The appended drawings illustrate only exemplary embodiments and therefore should not be considered as limiting its scope. Persons of ordinary skill in the art who have the benefit of this disclosure appreciate that the disclosed concepts lend themselves to other equally effective embodiments. In the drawings, the same numeral designators used in more than one drawing denote the same, similar, or equivalent functionality, components, or blocks.

DETAILED DESCRIPTION

The disclosed concepts relate generally to improving the performance of field programmable gate arrays (FPGAs). More particularly, the disclosed concepts improve FPGA performance by using on-die temperature sensing apparatus (e.g., an array of temperature sensors or temperature sensor array) and related techniques.

To combat the increasing levels of heat dissipation in modern FPGAs, designers tend to use power-supply voltage ($V_{DD}$) scaling. The $V_{DD}$ scaling in relatively advanced fabrication technologies is becoming more steeper than transistor threshold voltage ($V_T$) scaling.

As the $V_{DD}$ to $V_T$ ratio continues to decrease, the speed path suffers from temperature inversion, where the worst case delay does not occur at hot temperatures, but rather at cold temperatures. This phenomenon is worse for slow semiconductor material (e.g., relatively low conductivity) because of the corresponding relatively high transistor threshold voltages.

More specifically, a reduced gate voltage overdrive, typically resulted in reduced speeds of operation occurring at a relatively high temperature (e.g., 85° C.). At relatively low temperatures (e.g., −40° C.), the transistor threshold voltage increases (compared to higher temperatures). Because of the reduced gate voltage overdrive, the increasing higher threshold voltage causes slower operation speeds at lower temperature, the phenomenon of temperature inversion.

The disclosed concepts contemplate two techniques of increasing transistor performance and, hence, improving the performance of the FPGA. First, increasing the supply voltage (by modulating $V_{DD}$) causes an increase in the drain current(s) of one or more transistors, thus resulting in an increase in performance. Second, changing the body bias level of one or more transistors (i.e., forward biasing the gate-source junction), which lowers the transistor threshold voltage, increases the transistor's current-handling capability and, hence, its performance.

Figure 1:
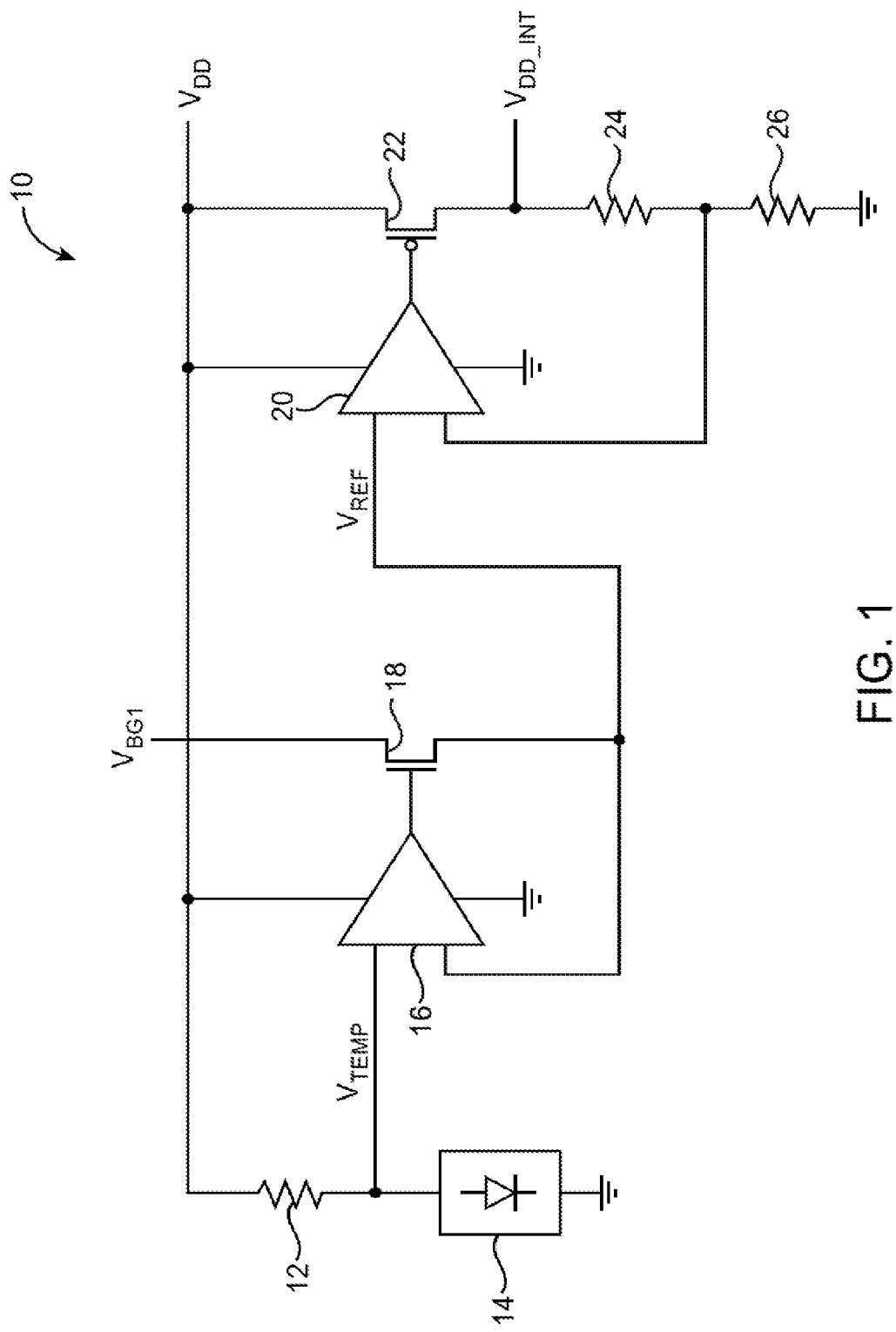
FIG. 1 illustrates a circuit for modulating the power supply voltage of an FPGA, according to an exemplary embodiment.

FIG. 1 illustrates a circuit 10 for modulating the power supply voltage ($V_{DD}$) of an FPGA, according to an exemplary embodiment. The supply voltage modulation circuit 10 uses on-die temperature sensors that cause the modulation of the supply voltage to increase transistor speeds as temperature decreases.

Supply voltage modulation circuit 10 includes an array of temperature sensors (or temperature sensor array) 14, a bias element 12, amplifiers 16 and 20, resistors 24 and 26, and transistors 18 and 22. In some embodiments, the array of temperature sensors 14 may include a plurality of diodes. In some embodiments, bias element 12 may constitute a resistor, although one may use other biasing techniques, such as current sources. In some embodiments, amplifiers 16 and 20 constitute operational amplifiers. Note, however, that one may use a variety of other circuit configurations and elements, as persons of ordinary skill in the art who have the benefit of the description of the disclosed concepts understand.

Biasing element 12 biases the array of temperature sensors 14. In response, array of temperature sensors 14 produces a signal, VTEMP, that corresponds to the die temperatures at several locations.

Amplifier 16 compares the signal VTEMP to a reference signal, VREF. Signal VREF constitutes a signal from a band-gap reference, VBG1, as supplied via transistor 18. In the embodiment shown, amplifier 16 has a unity-gain configuration. At its output, amplifier 16 supplies to transistor 18 a signal that corresponds to the difference between the signals VTEMP and VREF.

VREF constitutes the reference supply to the VDD regulator circuit, which includes amplifier 20. Amplifier 20 compares the signal VREF with a signal derived from the internal core supply voltage ($V_{DD\_INT}$), i.e., the supply voltage for the core circuitry of the FPGA, which includes, for example, programmable interconnect, programmable logic, processors, memory, etc.

Resistor 24 and resistor 26 form a voltage divider. The voltage divider supplies to one input of amplifier 20 a signal proportional to the internal core supply voltage ($V_{DD\_INT}$). By comparing the signal from the voltage divider to the reference voltage (VREF), amplifier 20 provides a modulation signal to transistor 22. In response, transistor 22 modulates the level of the internal core supply voltage ($V_{DD\_INT}$).

In exemplary embodiments, the signal VTEMP has a negative temperature coefficient. Thus, for a given level of bias supplied by biasing element 12, the level of the signal VTEMP decreases as the die temperature(s) increases.

When the signal VTEMP changes, the signal VREF also changes because of the unity-gain configuration of amplifier 16. In effect, in the embodiment shown, the signal VREF tracks the signal VTEMP. Thus, as the signal VREF changes, the internal core supply voltage ($V_{DD\_INT}$) changes to provide the desired output value as a function of temperature sensed by the array of temperature sensors 14.

Conceptually, as the die temperature decreases, transistor threshold voltages increase. But the transistor mobilities do not increase fast enough to cancel the change in the threshold voltages, thus resulting in a delay increase at cold temperatures compared to hot temperatures. The supply voltage modulation circuit 10 increases the internal core supply voltage ($V_{DD\_INT}$) as a function of temperature to compensate for the increase in the threshold voltages and the increasing $I_{DSAT}$/mobility of transistors.

As the power dissipation is lower at cold temperatures compared to hot temperatures, this additional increase in the internal core supply voltage ($V_{DD\_INT}$) does not adversely affect power dissipation. This attributes allows the designer to not resort to wider transistors and/or lower threshold voltage transistors in order to improve speed, which will impact overall leakage at hot temperatures.

Figure 2:
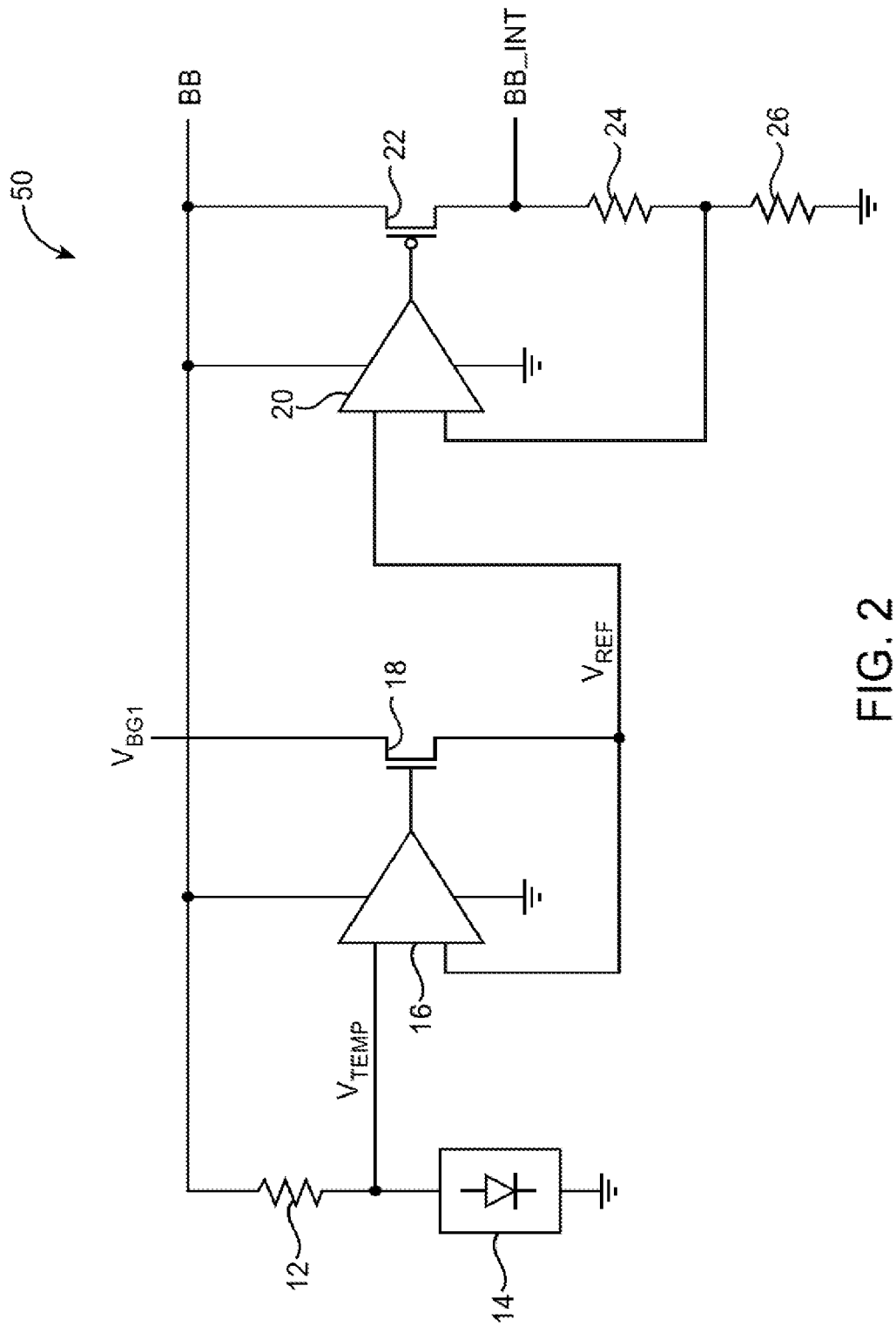
FIG. 2 depicts a circuit for modulating the body bias signal used by an FPGA, according to an exemplary embodiment.

FIG. 2 depicts a circuit 50 for modulating the body bias signal used by an FPGA, according to an exemplary embodiment. The body bias modulation circuit 50 uses on-die temperature sensors that cause the modulation of the body bias to increase transistor speeds as temperature decreases.

Body bias modulation circuit 50 includes an array of temperature sensors (or temperature sensor array) 14, a bias element 12, amplifiers 16 and 20, resistors 24 and 26, and transistors 18 and 22. In some embodiments, the array of temperature sensors 14 may include a plurality of diodes. In some embodiments, bias element 12 may constitute a resistor, although one may use other biasing techniques, such as current sources. In some embodiments, amplifiers 16 and 20 constitute operational amplifiers. Note, however, that one may use a variety of other circuit configurations and elements, as persons of ordinary skill in the art who have the benefit of the description of the disclosed concepts understand.

Biasing element 12 biases the array of temperature sensors 14. In response, array of temperature sensors 14 produces a signal, VTEMP, that corresponds to the die temperatures at several locations.

Amplifier 16 compares the signal VTEMP to a reference signal, VREF. Signal VREF constitutes a signal from a band-gap reference, VBG1, as supplied via transistor 18. In the embodiment shown, amplifier 16 has a unity-gain configuration. At its output, amplifier 16 supplies to transistor 18 a signal that corresponds to the difference between the signals VTEMP and VREF.

VREF constitutes the reference supply to the body bias regulator circuit, which includes amplifier 20. Amplifier 20 compares the signal VREF with a signal derived from the internal core body bias signal (BB_INT), i.e., the body bias for one or more transistors in the core circuitry of the FPGA, which includes, for example, programmable interconnect, programmable logic, etc.

Resistor 24 and resistor 26 form a voltage divider. The voltage divider supplies to one input of amplifier 20 a signal proportional to the internal body bias signal (BB_INT). By comparing the signal from the voltage divider to the reference voltage (VREF), amplifier 20 provides a modulation signal to transistor 22. In response, transistor 22 modulates the level of the internal body bias signal (BB_INT).

In exemplary embodiments, the signal VTEMP has a negative temperature coefficient. Thus, for a given level of bias supplied by biasing element 12, the level of the signal VTEMP decreases as the die temperature(s) increases.

When the signal VTEMP changes, the signal VREF also changes because of the unity-gain configuration of amplifier 16. As a result, in the embodiment shown, the signal VREF tracks the signal VTEMP. Hence, as the signal VREF changes, the internal core body bias signal (BB_INT) changes to provide the desired output value as a function of temperature sensed by the array of temperature sensors 14.

In effect, as the die temperature decreases, transistor threshold voltages increase. By modulating the body bias of one ore more transistors, body bias modulation circuit 50 causes the transistor threshold voltage to decrease. As a result, the transistor gate drive voltage (i.e., the difference between the gate-source voltage and the threshold voltage) and, hence, the transistor speed, increases.

One may apply supply voltage modulation and/or body bias modulation to one or more circuits within the FPGA. In some embodiments, supply voltage modulation and/or body bias modulation is applied to the FPGA's core circuitry, which may include, for example, programmable logic, programmable interconnect, processors, memory, etc., as described below in detail. In other embodiments, in addition to the core circuitry, one may apply supply voltage modulation and/or body bias modulation to other circuitry (i.e., non-core circuitry) in the FPGA, for example, input/out (I/O) circuitry, test/debug circuitry, etc.

Figure 3:
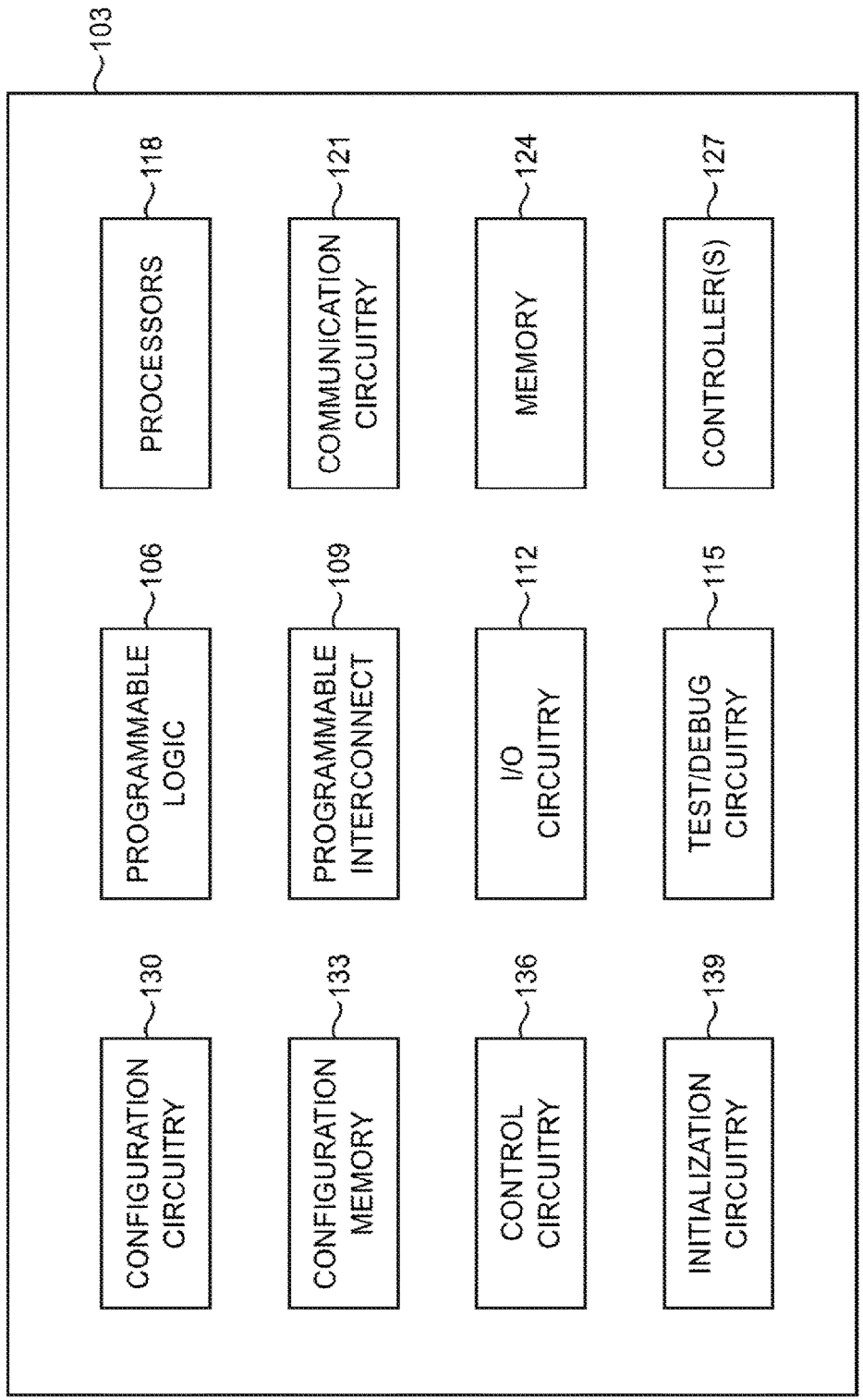
FIG. 3 shows a general block diagram of an FPGA that may use supply voltage modulation and/or body bias modulation.

FIG. 3 shows a general block diagram of an FPGA 103 that may use supply voltage modulation and/or body bias modulation. FPGA 103 includes configuration circuitry 130, configuration memory (CRAM) 133, control circuitry 136, programmable logic 106, programmable interconnect 109, and I/O circuitry 112. In addition, FPGA 103 may include test/debug circuitry 115, one or more processors 118, one or more communication circuitry 121, one or more memories 124, one or more controllers 127, and initialization circuit 139, as desired.

Note that the figure shows a simplified block diagram of FPGA 103. Thus, FPGA 103 may include other blocks and circuitry, as persons of ordinary skill in the art understand. Examples of such circuitry include clock generation and distribution circuits, redundancy circuits, and the like. Furthermore, FPGA 103 may include, analog circuitry, other digital circuitry, and/or mixed-mode circuitry, as desired.

Programmable logic 106 includes blocks of configurable or programmable logic circuitry, such as look-up tables (LUTs), product-term logic, multiplexers (MUXs), logic gates, registers, memory, and the like. Programmable interconnect 109 couples to programmable logic 106 and provides configurable interconnects (coupling mechanisms) between various blocks within programmable logic 106 and other circuitry within or outside FPGA 103.

Control circuitry 136 controls various operations within FPGA 103. Under the supervision of control circuitry 136, FPGA configuration circuitry 130 uses configuration data (which it obtains from an external source, such as a storage device, a host, etc.) to program or configure the functionality of FPGA 103. Configuration data are typically stored in CRAM 133. The contents of CRAM 133 determine the functionality of various blocks of FPGA 103, such as programmable logic 106 and programmable interconnect 109. Initialization circuit 139 may cause the performance of various functions at reset or power-up of FPGA 103.

I/O circuitry 112 may constitute a wide variety of I/O devices or circuits, as persons of ordinary skill in the art who have the benefit of the disclosure understand. I/O circuitry 112 may couple to various parts of FPGA 103, for example, programmable logic 106 and programmable interconnect 109. I/O circuitry 112 provides a mechanism and circuitry for various blocks within FPGA 103 to communicate with external circuitry or devices.

Test/debug circuitry 115 facilitates the testing and troubleshooting of various blocks and circuits within FPGA 103. Test/debug circuitry 115 may include a variety of blocks or circuits known to persons of ordinary skill in the art who have the benefit of the disclosure. For example, test/debug circuitry 115 may include circuits for performing tests after FPGA 103 powers up or resets, as desired. Test/debug circuitry 115 may also include coding and parity circuits, as desired.

FPGA 103 may include one or more processors 118. Processor 118 may couple to other blocks and circuits within FPGA 103. Processor 118 may receive data and information from circuits within or external to FPGA 103 and process the information in a wide variety of ways, as persons skilled in the art with the benefit of the disclosure in this document appreciate. One or more of processor(s) 118 may constitute a digital signal processor (DSP). DSPs allow performing a wide variety of signal processing tasks, such as compression, decompression, audio processing, video processing, filtering, and the like, as desired.

FPGA 103 may also include one or more communication circuits 121. Communication circuit(s) 121 may facilitate data and information exchange between various circuits within FPGA 103 and circuits external to FPGA 103, as persons of ordinary skill in the art who have the benefit of the disclosure in this document understand.

FPGA 103 may further include one or more memories 124 and one or more controller(s) 127. Memory 124 allows the storage of various data and information (such as user-data, intermediate results, calculation results, etc.) within FPGA 103. Memory 124 may have a granular or block form, as desired. Controller 127 allows interfacing to, and controlling the operation and various functions of circuitry outside the FPGA. For example, controller 127 may constitute a memory controller that interfaces to and controls an external synchronous dynamic random access memory (SDRAM), as desired.

As noted above, generally speaking, one may apply supply voltage modulation and/or body bias modulation to one or more circuits within FPGA 103. Thus, one may apply supply voltage modulation to one or more transistors, blocks, or circuits within FPGA 103. In addition, or instead, one may apply body bias modulation to one or more transistors, blocks, or circuits within FPGA 103.

Typically, the core circuitry of FPGA 103 includes, among other circuitry, programmable logic 106 and programmable interconnect 109. The programmable logic 106 and programmable interconnect 109 often reside within the FPGA in an array or regular structure, for example, a two-dimensional array.

Figure 4:
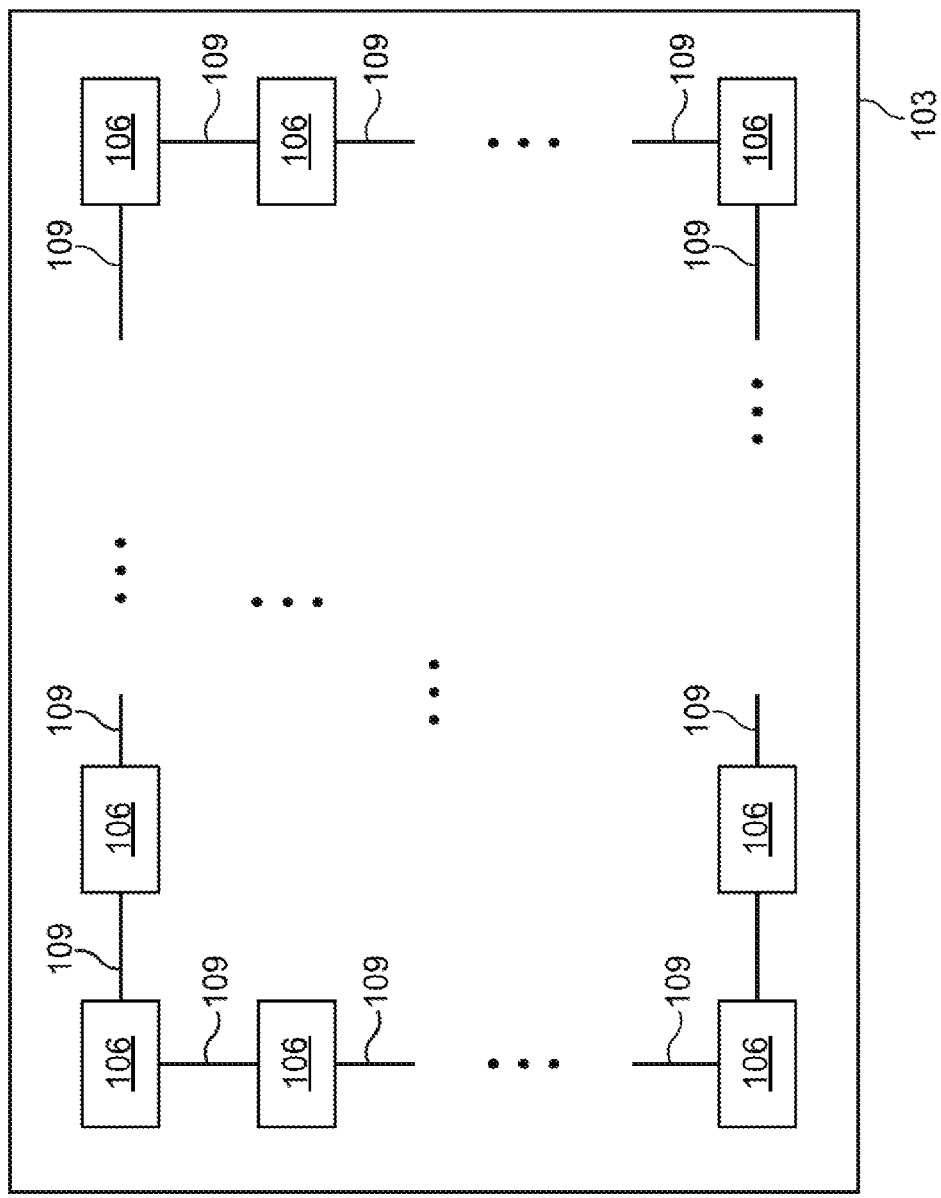
FIG. 4 illustrates a floor-plan of an FPGA that may use supply voltage modulation and/or body bias modulation.

FIG. 4 illustrates a floor-plan of an FPGA that may use supply voltage modulation and/or body bias modulation. FPGA 103 includes programmable logic 106 arranged as a two-dimensional array. Programmable interconnect 109, arranged as horizontal interconnect and vertical interconnect, couples the blocks of programmable logic 106 to one another. One may place the blocks in a particular manner so as to implement a user's design, as persons of ordinary skill in the art who have the benefit of the disclosure in this document understand. A block, part of a block, or a set of blocks may constitute a tile or region of FPGA 103.

One may use supply voltage modulation and/or body bias modulation in one or more of programmable logic 106 shown in FIG. 4. Furthermore, one may use supply voltage modulation and/or body bias modulation in one or more of programmable interconnect 109 shown in FIG. 4.

One may apply supply voltage modulation and/or body bias modulation to circuitry within an FPGA with any desired level of granularity. In illustrative embodiments, FPGA 103 has a hierarchical architecture. In other words, each block of programmable logic 106 may in turn include smaller or more granular programmable logic blocks or circuits. For example, in one embodiment, programmable logic 106 may constitute blocks of configurable logic named logic array block (LAB), and each LAB may include logic elements (LEs) or other circuitry, as desired. In other embodiments, programmable logic 106 may include circuitry known as MLAB.

Figure 5:
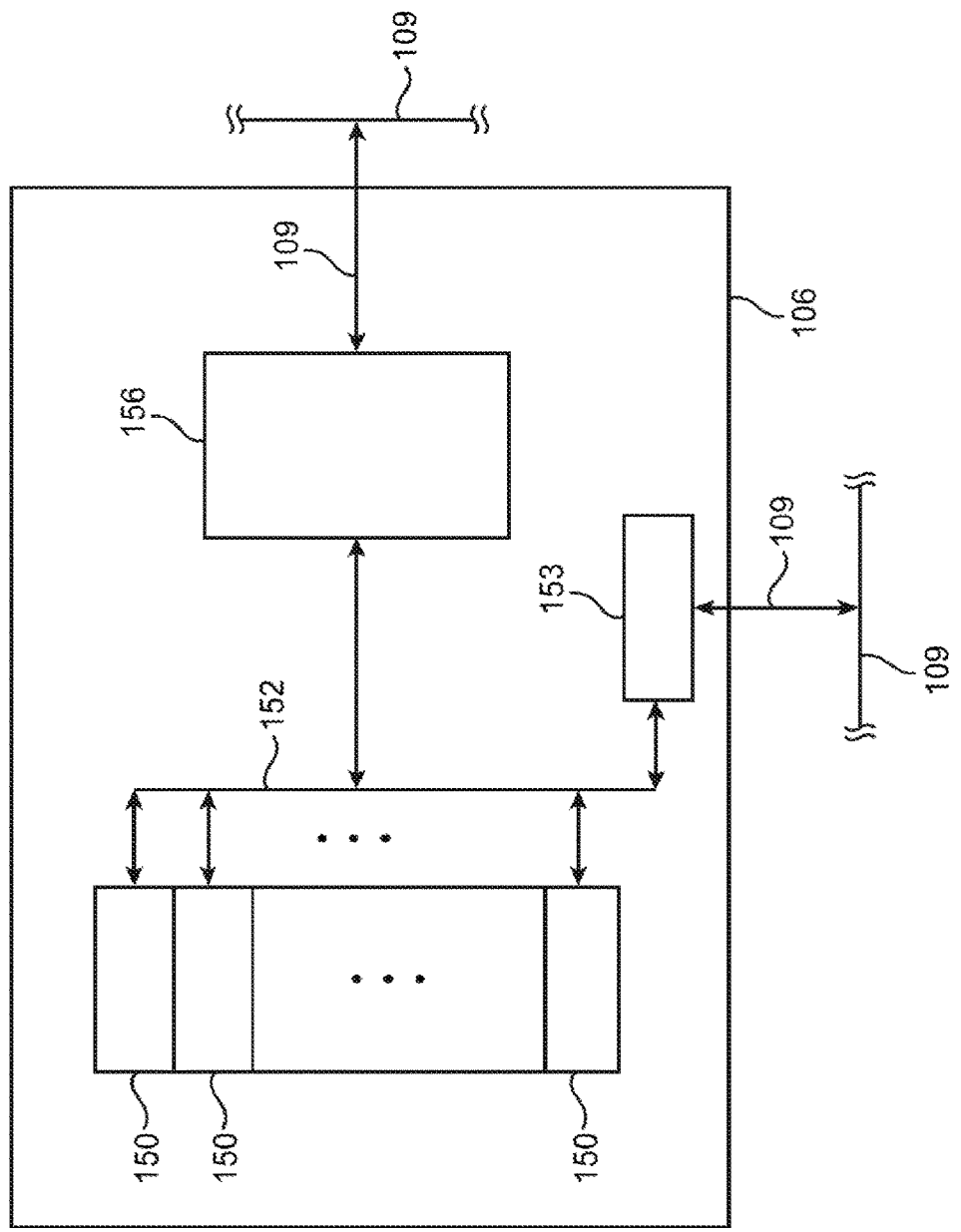
FIG. 5 shows a conceptual, simplified block diagram of programmable logic and programmable interconnect in an FPGA according to an exemplary embodiment.

FIG. 5 shows a conceptual, simplified block diagram of programmable logic 106 and programmable interconnect 109 in an FPGA according to an exemplary embodiment.

Programmable logic 106 includes logic elements or programmable logic circuits or blocks 150, local interconnect 152, interface circuit 153, and interface circuit 156.

Logic elements 150 provide configurable or programmable logic functions, for example, LUTs, registers, product-term logic, etc., as persons of ordinary skill in the art who have the benefit of the description of the invention understand. Local interconnect 152 provides a configurable or programmable mechanism for logic elements 150 to couple to one another or to programmable interconnect 109 (sometimes called "global interconnect"), as desired.

Interface circuit 156 and interface circuit 159 provide a configurable or programmable way for programmable logic 106 block of circuitry to couple to programmable interconnect 109 (and hence to other programmable logic 106). Interface circuit 156 and interface circuit 159 may include multiplexers (MUXs), registers, buffers, drivers, and the like, as persons of ordinary skill in the art who have the benefit of the description of the invention understand.

One may use a wide variety of speed and type distributions of logic elements 150, as desired. The particular choice for a given design depends on a number of factors, such as the design and performance specifications, the number and type of resources available, etc., as persons of ordinary skill in the art who have the benefit of the description of the invention understand. Note that, to achieve finer granularity, one may apply the power management techniques to circuitry within logic elements 158, as desired. For example, one may apply the techniques to transistor or groups of transistors, as desired.

Generally speaking, one may provide a suitable or desired distribution and configuration of the various types/grades of logic elements 150 (or circuitry within them) to achieve a certain percentage (and placement or distribution) of speed grades. Furthermore, one may use the distribution and configuration of logic elements 150 of various characteristics (speed, power consumption) to provide higher-level programmable logic blocks 106 having desired speed and power consumption characteristics.

Conversely, one may apply the may apply the disclosed power supply modulation and/or body bias modulation techniques on coarser levels of granularity, as desired. In some embodiments, one may apply the techniques to one block or a group of blocks of circuitry that include programmable logic (e.g., groups of LABs). Generally speaking, one may use a mixture of resources of varying types in order to achieve overall percentages of resources with given characteristics.

Figure 6:
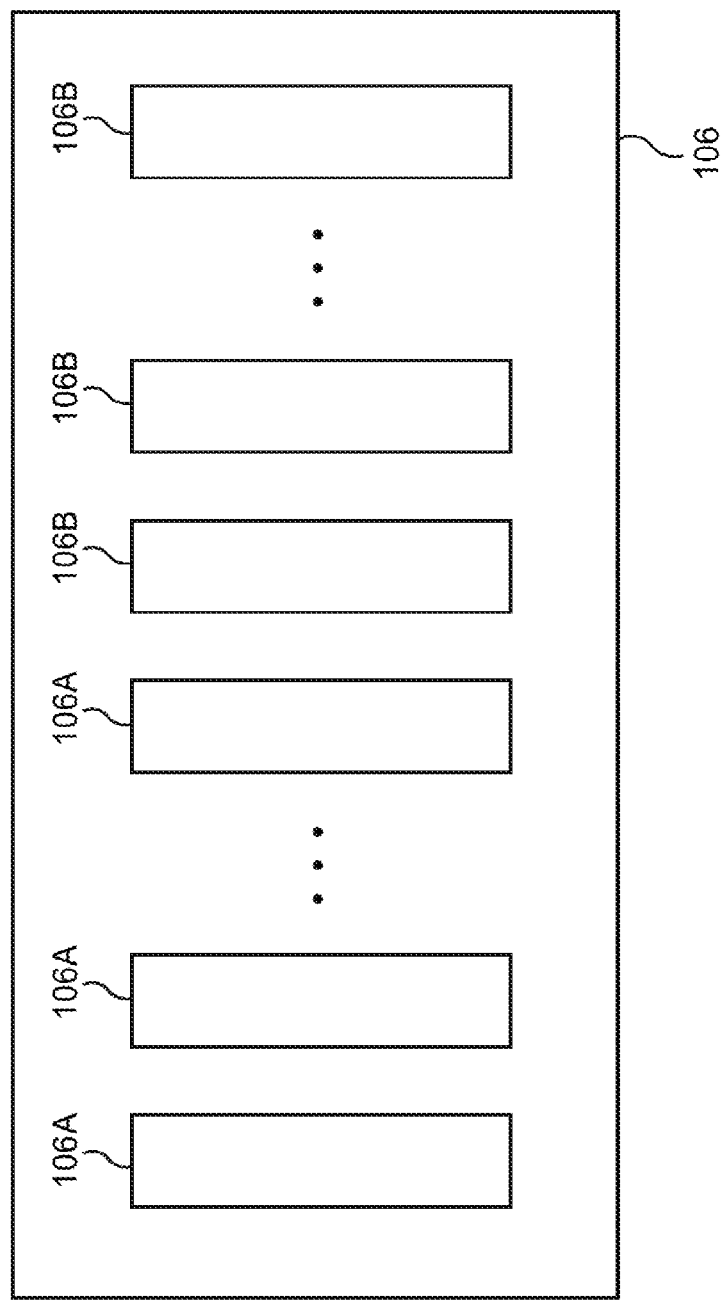
FIG. 6 depicts an example of applying supply voltage modulation and/or body bias modulation according to an exemplary embodiment.

In some embodiments, one may apply supply voltage modulation and/or body bias modulation to all blocks that comprise programmable logic 106 (and/or programmable interconnect 109). In some other embodiments, one may apply supply voltage modulation and/or body bias modulation to a subset of those blocks. For example, in one embodiment, one may apply supply voltage modulation and/or body bias modulation to some LABs, but not others. FIG. 6 shows such a situation, where programmable logic 106A have a different level of power supply voltage and/or body bias than do programmable logic 106B. In yet other embodiments, one may apply supply voltage modulation and/or body bias modulation to some of the blocks (e.g., LEs) within some LABs.

Note that the above examples constitute merely exemplary embodiments. As persons of ordinary skill in the art who have the benefit of the description of the disclosed concepts understand, one may apply supply voltage modulation and/or body bias modulation with other types and levels of granularity, as desired. Furthermore, note that the above description applies to circuitry within FPGAs that might have names other than LABs, LEs, MLABs, and the like, as persons of ordinary skill in the art who have the benefit of the description of the disclosed concepts understand.

Figure 7:
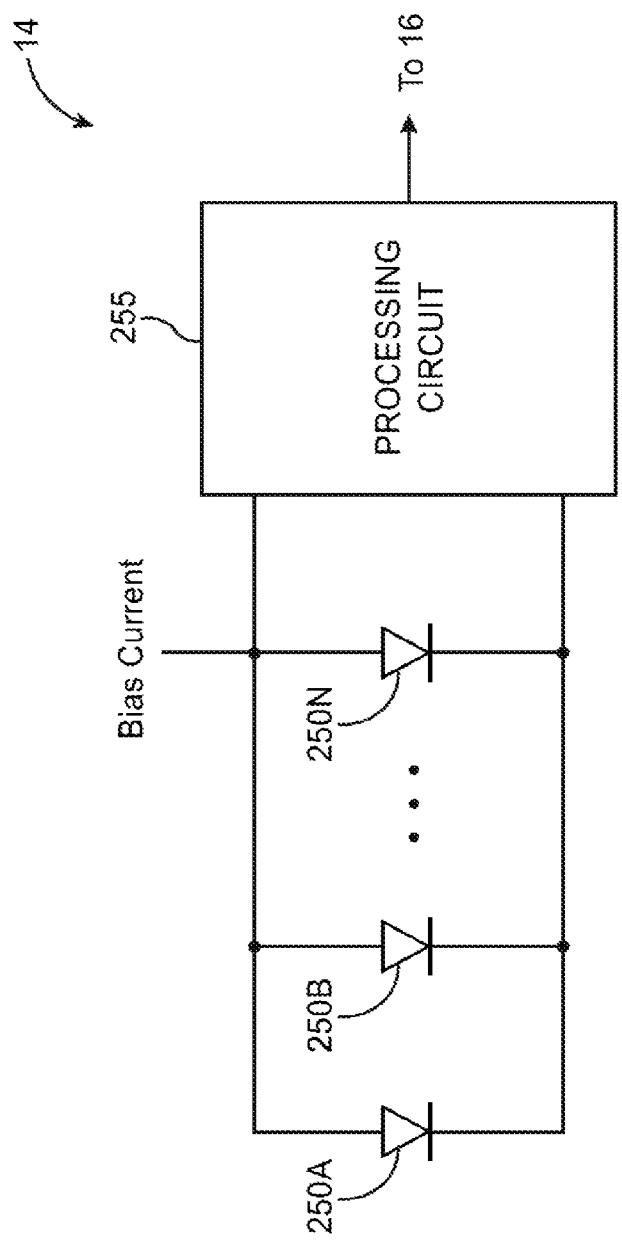
FIG. 7 illustrates a temperature sensor array according to an exemplary embodiment.

As noted, supply voltage modulation and body bias modulation according to the disclosed concepts employ a temperature sensor array. FIG. 7 depicts a temperature sensor array 14 according to an exemplary embodiment.

Temperature sensor array 14 includes an array of N diodes labeled as 250A-250N, where N denotes a desired number of diodes. In this particular embodiment, diodes 250A-250N are coupled in parallel. A biasing current (for example, supplied by biasing element 12 (not shown explicitly)) biases diodes 250A-250N. Diodes 250A-250N may reside in various areas of the FPGA. Each of 250A-250N senses the temperature in the particular part of the FPGA die in which it resides. Thus, diodes 250A-250N provide a composite temperature profile of the FPGA.

Temperature sensor array 14 may also include processing circuit 255. Processing circuit 255 processes the signal provided by diodes 250A-250N (which corresponds to the FPGA temperature profile), and provides the resulting signal to amplifier 20 (not shown explicitly). In one embodiment, processing circuit 255 may buffer the signal received from diodes 250A-250N. In another embodiment, processing circuit 255 may amplify the signal received from diodes 250A-250N.

Figure 8:
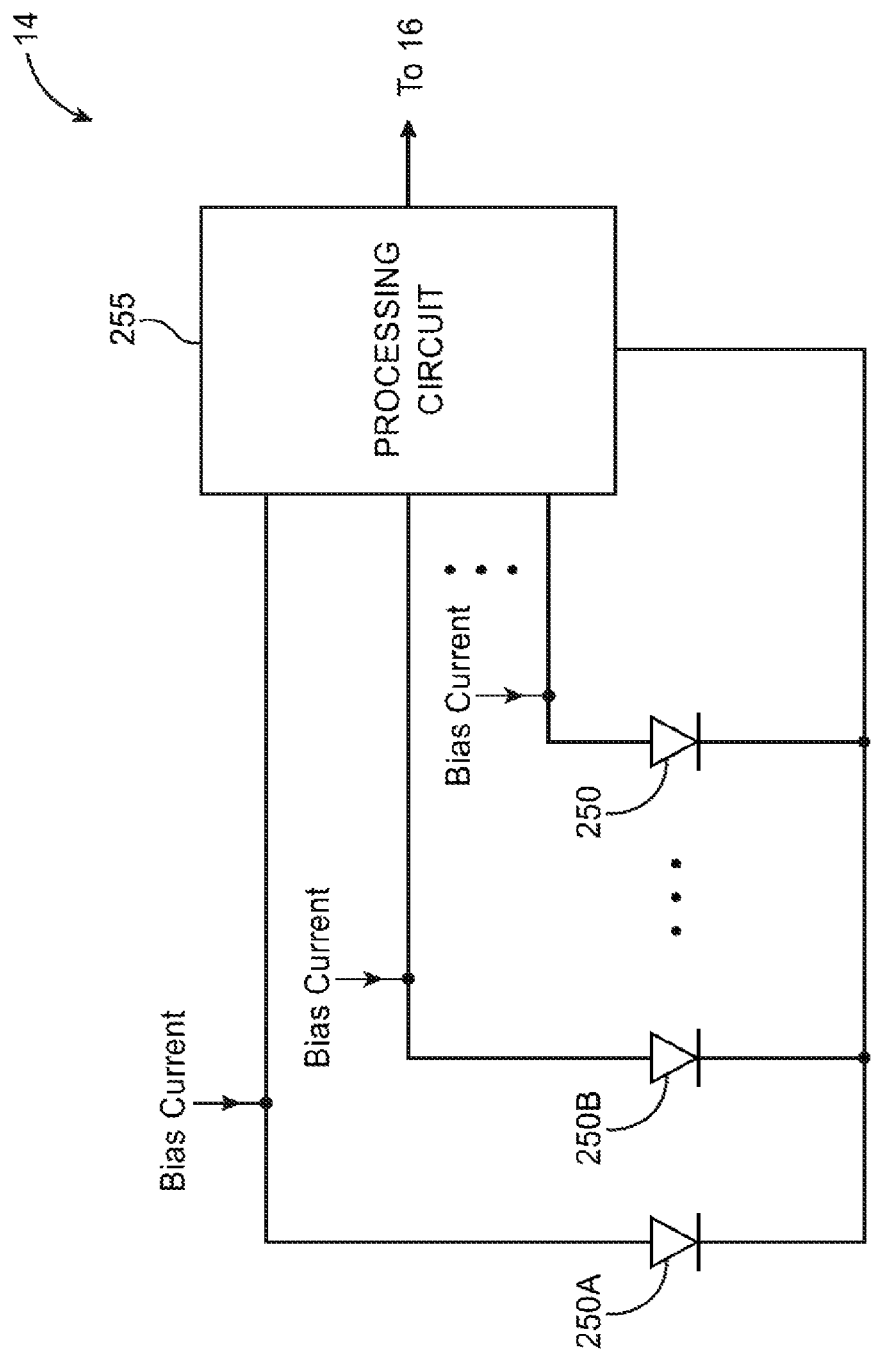
FIG. 8 shows a temperature sensor array according to another exemplary embodiment.

FIG. 8 shows a temperature sensor array 14 according to another exemplary embodiment. Temperature sensor array 14 includes an array of N diodes labeled as 250A-250N, where N represents a desired number of diodes. In the embodiment shown, each of diodes 250A-250N receives a biasing current (for example, a current derived from the bias current supplied by biasing element 12 (not shown explicitly)).

Diodes 250A-250N may reside in various areas of the FPGA. Each of 250A-250N senses the temperature in the particular part of the FPGA die in which it resides. Thus, diodes 250A-250N provide a set of N signals, each of which corresponding to a particular part of the FPGA die.

Temperature sensor array 14 may also include processing circuit 255. Processing circuit 255 processes the signals provided by diodes 250A-250N to generate an output signal. Processing circuit 255 provides its output signal to amplifier 20 (not shown explicitly).

Processing circuit 255 may process the signals received from diodes 250A-250N in a variety of ways, as desired. In one embodiment, processing circuit 255 may select a signal from among the signals from diodes 250A-250N that corresponds to a minimum temperature region of the FPGA die. In another embodiment, processing circuit 255 may select a signal from among the signals from diodes 250A-250N that corresponds to a maximum temperature region of the FPGA die.

In another embodiment, processing circuit 255 may generate an average signal for the signals from diodes 250A-250N (i.e., a signal that that corresponds to an average temperature of the FPGA die). In yet another embodiment, processing circuit 255 may generate a weighted sum or average signal for the signals from diodes 250A-250N (i.e., a sum produced by giving specific weights to the signals received from diodes 250A-250N, or an average of those weighted signals). In addition, processing circuit 255 may buffer the signals received from diodes 250A-250N, and/or amplify those signals, as desired.

Note that the above illustrative embodiments constitute mere examples. As persons of ordinary skill in the art who have the benefit of the description of the disclosed concepts understand, processing circuit 255 may perform a variety of processing functions on the signals received from diodes 250A-250N, as desired.

Furthermore, note that in some embodiments, one may use the same temperature sensor array to perform both supply voltage modulation and body bias modulation. In other embodiments, one may use one use temperature sensor array to perform supply voltage modulation, and another temperature sensor array to perform body bias modulation.

Figure 9:
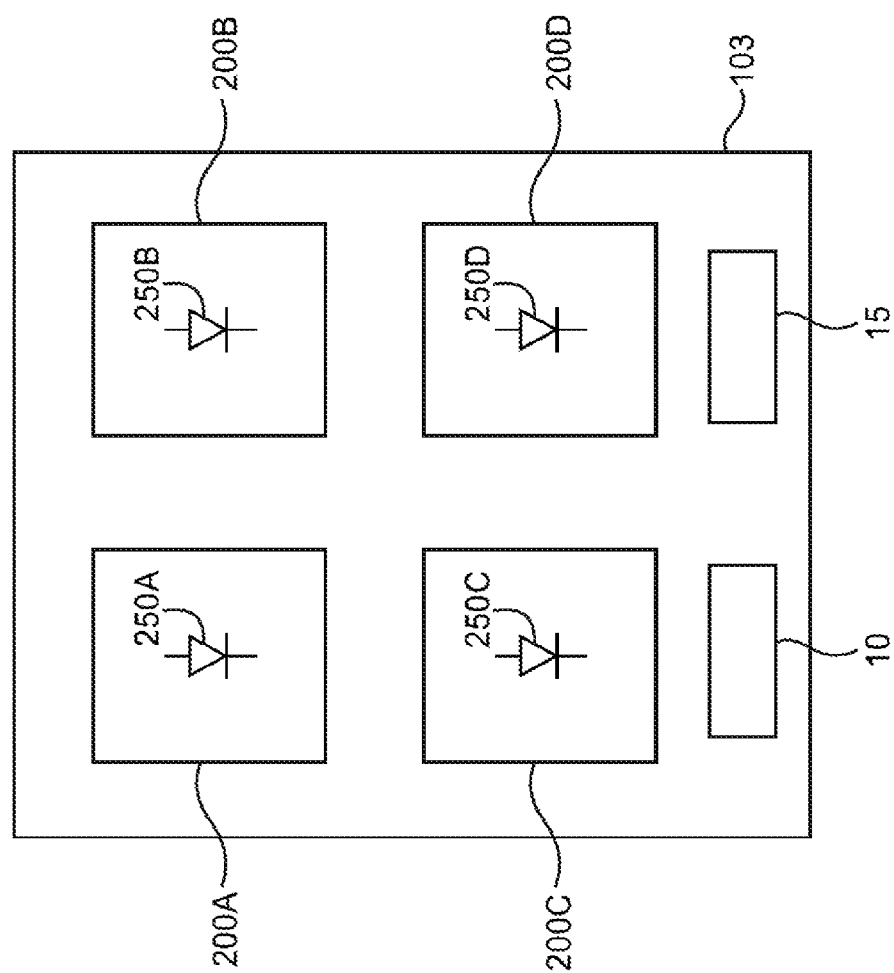
FIG. 9 illustrates an example of the placement of the temperature sensor array according an illustrative embodiment.
Figure 10:
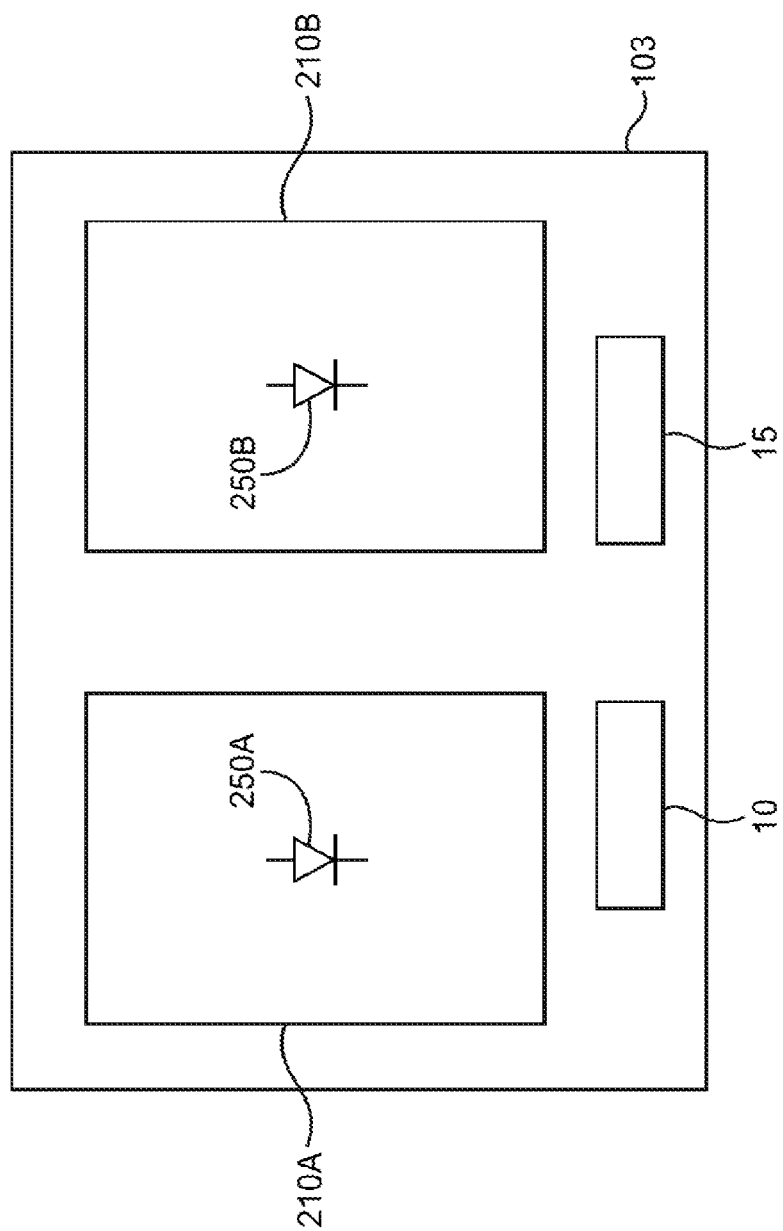
FIG. 10 depicts another example of the placement of the temperature sensor array according an illustrative embodiment.
Figure 11:
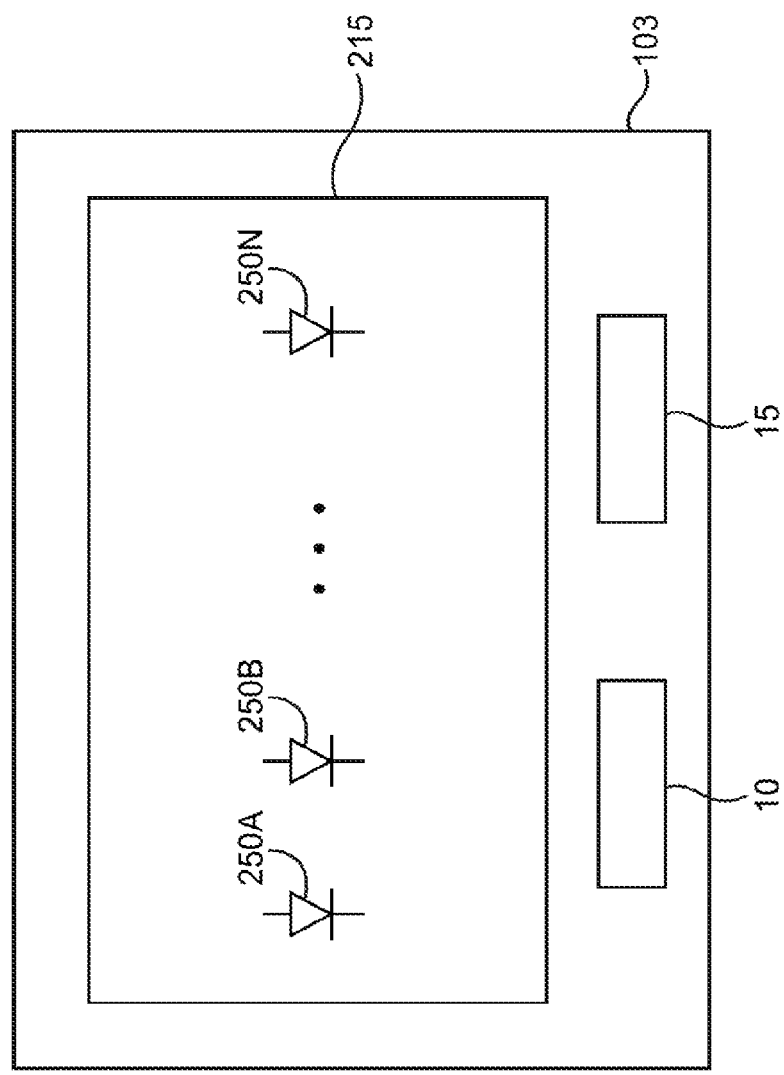
FIG. 11 shows yet another example of the placement of the temperature sensor array according an illustrative embodiment.

One may position diodes 250A-250N across the FPGA die (or in a desired region or a number of desired regions of the FPGA die). FIGS. 9-11 provide examples of the placement of diodes 250A-250N in FPGA 103. Note that, although FIGS. 9-11 show both supply voltage modulation circuit 10 and body bias modulation circuit 50 in FPGA 103, one may use one or both of those circuits, as desired, and as persons of ordinary skill in the art who have the benefit of the description of the disclosed concepts understand.

Thus, in some embodiments, FPGA 103 includes supply voltage modulation circuit 10. In other embodiments, FPGA 103 includes body bias modulation circuit 50. In yet other embodiments, FPGA 103 includes both supply voltage modulation circuit 10 and body bias modulation circuit 50.

Referring to FIG. 9, in this embodiment, FPGA 103 has four quadrants, 200A-200D. Each quadrant has a corresponding diode, 250A-250D, respectively. Diodes 250A-250D provide a measure of the temperature of the FPGA die for their respective quadrants.

In the embodiment in FIG. 10, FPGA 103 has two halves, 210A-210B. Each half has a corresponding diode, 250A-250B, respectively. Diodes 250A-250B provide a measure of the temperature of the FPGA die for their respective halves.

In the embodiment shown in FIG. 11, FPGA 103 has core circuitry 215, which uses N diodes, 250A-250N. In some embodiments, diodes 250A-250N may be placed and distributed uniformly throughout core 215. In other embodiments, diodes 250A-250N may be placed and distributed non-uniformly throughout core 215.

Note that the examples shown in FIGS. 9-11 constitute mere examples. One may place and distribute the diodes of temperature sensor array 14 within FPGA 103 in a wide variety of other ways, as persons of ordinary skill in the art who have the benefit of the description of the disclosed concepts understand.

As persons of ordinary skill in the art who have the benefit of the description of the disclosed concepts understand, one may apply the disclosed concepts effectively to various types of programmable integrated circuits. Examples described in this document, which refer to FPGAs, constitute merely illustrative applications, and are not intended to limit the application of the disclosed concepts to other ICs, such as PLDs, CPLDs, and the like, by making appropriate modifications. Those modifications fall within the knowledge and level of skill of persons of ordinary skill in the art who have the benefit of the description of the disclosed concepts.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation, as persons of ordinary skill in the art who have the benefit of the description of this disclosure understand. Other modifications and alternative embodiments in addition to those described here will be apparent to persons of ordinary skill in the art who have the benefit of this disclosure. Accordingly, this description teaches those skilled in the art the manner of carrying out the disclosed concepts and are to be construed as illustrative only.

The forms and embodiments shown and described should be taken as illustrative embodiments. Persons skilled in the art may make various changes in the shape, size and arrangement of parts without departing from the scope of the disclosed concepts in this document. For example, persons skilled in the art may substitute equivalent elements for the elements illustrated and described here. Moreover, persons skilled in the art who have the benefit of this disclosure may use certain features of the disclosed concepts independently of the use of other features, without departing from the scope of the disclosed concepts.

The invention claimed is:

1. An integrated circuit device comprising:
   a field programmable gate array (FPGA) fabric;
   one or more on-chip temperature sensors configured to detect temperature of the FPGA fabric; and
   supply voltage modulation control circuitry configured to control a first voltage of the integrated circuit device to be a higher voltage at a first time when the temperature indicates that less heat is present on the FPGA fabric and to be a lower voltage at a second time when the temperature indicates that more heat is present on the FPGA fabric, wherein the first voltage comprises an internal core supply voltage to a first portion of the integrated circuit device, and wherein the supply voltage modulation control circuitry is configured to modulate the internal core supply voltage but not to modulate a second voltage supplied to a second portion of the integrated circuit device.

2. The integrated circuit device of claim 1, wherein the one or more on-chip temperature sensors comprise more than one on-chip temperature sensor.

3. The integrated circuit device of claim 1, wherein the one or more on-chip temperature sensors comprise one or more diodes.

4. The integrated circuit device of claim 1, wherein the supply voltage modulation control circuitry is configured to operate as a closed-loop system.

5. The integrated circuit device of claim 1, wherein the integrated circuit device is configured to operate over a range of temperatures at least as low as −40 degrees Celsius.

6. The integrated circuit device of claim 1, wherein the integrated circuit device is configured to operate over a range of temperatures at least as high as 85 degrees Celsius.

7. The integrated circuit device of claim 1, wherein the supply voltage modulation control circuitry is connected to the one or more on-chip temperature sensors.

8. A method comprising:
   using one or more on-chip temperature sensors of an integrated circuit device to obtain a first signal responsive to temperature of field programmable gate array (FPGA) fabric of the integrated circuit device;
   using supply voltage modulation control circuitry to control at least two supply voltages of the integrated circuit device to have a higher voltage level when the first signal indicates lower heat dissipation, wherein the at least two supply voltages comprise an internal supply voltage of the FPGA fabric and a supply voltage of memory of the integrated circuit device; and using the supply voltage modulation control circuitry to control the internal supply voltage of the FPGA fabric and the supply voltage of the memory of the integrated circuit device to have a lower level when the first signal indicates higher heat.

9. The method of claim 8, wherein obtaining the first signal comprises obtaining an analog signal corresponding to the temperature of the FPGA fabric.

10. The method of claim 8, wherein the internal supply voltage of the FPGA fabric comprises an internal core supply voltage of the FPGA fabric.

11. The method of claim 8, wherein the internal supply voltage of the FPGA fabric comprises a positive supply voltage of the FPGA fabric.

12. The method of claim 8, comprising receiving a representation of the first signal into the supply voltage modulation control circuitry via a connection to the one or more on-chip temperature sensors.

13. The method of claim 8, wherein using the supply voltage modulation control circuitry comprises operating the supply voltage modulation control circuitry as a closed-loop system.

14. A system comprising:
field programmable gate array (FPGA) circuitry disposed on an integrated circuit;
a processor configured to receive and process data from the FPGA circuitry;
on-chip temperature sensing circuitry disposed on the integrated circuit, wherein the on-chip temperature sensing circuitry is configured to detect temperature of the FPGA circuitry; and
on-chip supply voltage modulation control circuitry disposed on the integrated circuit, wherein the on-chip supply voltage modulation control circuitry is connected to the on-chip temperature sensing circuitry and configured to receive a signal corresponding to the temperature of the FPGA circuitry from the on-chip temperature sensing circuitry, and wherein the on-chip supply voltage modulation control circuitry is configured to control a first voltage of the integrated circuit and a second voltage of the integrated circuit to be at a lower voltage level when the temperature indicates that more heat is present on the FPGA circuitry and to be at a higher voltage level when the temperature indicates that less heat is present on the FPGA circuitry, wherein the first voltage comprises an internal supply voltage to programmable logic of the FPGA circuitry, and wherein the second voltage comprises a supply voltage for block memory of the FPGA circuitry.

15. The system of claim 14, wherein the processor is disposed on the integrated circuit.

16. The system of claim 15, wherein the on-chip temperature sensing circuitry is configured to detect a temperature of the processor, and wherein the on-chip supply voltage modulation control circuitry is configured to control the first voltage of the first integrated circuit to be at the lower voltage level when the temperature indicates that more heat is present on the FPGA circuitry and the processor and to be at the higher voltage level when the temperature indicates that less heat is present on the FPGA circuitry and the processor.

17. The system of claim 14, comprising communication circuitry configured to communicate with circuits external to the integrated circuit.

18. The system of claim 14, comprising a memory controller configured to communicate with a memory device external to the integrated circuit.

19. The system of claim 14, wherein the on-chip temperature sensing circuitry comprises a plurality of on-chip temperature sensors.

* * * * *